United States Patent
Mitsugi et al.

(10) Patent No.: US 10,676,840 B2
(45) Date of Patent: Jun. 9, 2020

(54) METHOD OF EVALUATING MANUFACTURING PROCESS OF SILICON MATERIAL AND MANUFACTURING METHOD OF SILICON MATERIAL

(71) Applicant: SUMCO CORPORATION, Tokyo (JP)

(72) Inventors: Noritomo Mitsugi, Saga (JP); Kazutaka Eriguchi, Saga (JP); Shuichi Samata, Saga (JP); Ayumi Masada, Saga (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 15/788,142

(22) Filed: Oct. 19, 2017

(65) Prior Publication Data

US 2018/0179661 A1    Jun. 28, 2018

(30) Foreign Application Priority Data

Dec. 26, 2016 (JP) .................... 2016-250552

(51) Int. Cl.
| | |
|---|---|
| C30B 25/16 | (2006.01) |
| C30B 29/06 | (2006.01) |
| H01L 21/66 | (2006.01) |
| G01R 31/26 | (2020.01) |
| C30B 25/20 | (2006.01) |

(52) U.S. Cl.
CPC .............. *C30B 25/16* (2013.01); *C30B 25/20* (2013.01); *C30B 29/06* (2013.01); *G01R 31/2648* (2013.01); *H01L 22/12* (2013.01); *H01L 22/20* (2013.01)

(58) Field of Classification Search
CPC ...... H01L 21/20; H01L 21/205; H01L 21/322; H01L 21/66
See application file for complete search history.

(56) References Cited

U.S. PATENT DOCUMENTS

2011/0020241 A1* 1/2011 Tsukada ............... B82Y 15/00
424/9.6

FOREIGN PATENT DOCUMENTS

| JP | 03165538 A | * 7/1991 |
|---|---|---|
| JP | H11-240780 A | 9/1999 |

(Continued)

OTHER PUBLICATIONS

JP Office Action dated Sep. 24, 2019 issued in corresponding JP Application No. 2016-250552 with English Machine Translation.

*Primary Examiner* — Hua Qi

(74) *Attorney, Agent, or Firm* — Greenblum & Bernstein, P.L.C.

(57) ABSTRACT

The method is a method of evaluating a manufacturing process of a silicon material, wherein the manufacturing process includes a process that uses a member containing a carbon-containing sintered body, and the method of evaluating the manufacturing process of a silicon material includes performing DLTS measurement on a silicon material manufactured in the manufacturing process, and estimating a heavy metal contamination source of a silicon material manufactured in the manufacturing process with an indicator in the form of presence/absence of detection of a peak of a carbon-related level and presence/absence of detection of a peak of a heavy metal-related level in a DLTS spectrum obtained by the DLTS measurement.

9 Claims, 1 Drawing Sheet

(56) References Cited

FOREIGN PATENT DOCUMENTS

| | | | | |
|---|---|---|---|---|
| JP | 2000-327461 A | | 11/2000 | |
| JP | 2000327461 A | * | 11/2000 | ........... C04B 41/009 |
| JP | 2009-249267 | | 10/2009 | |
| JP | 2014099478 A | * | 5/2014 | |
| JP | 3204579 | | 6/2016 | |
| JP | 2016108159 A | * | 6/2016 | |

* cited by examiner

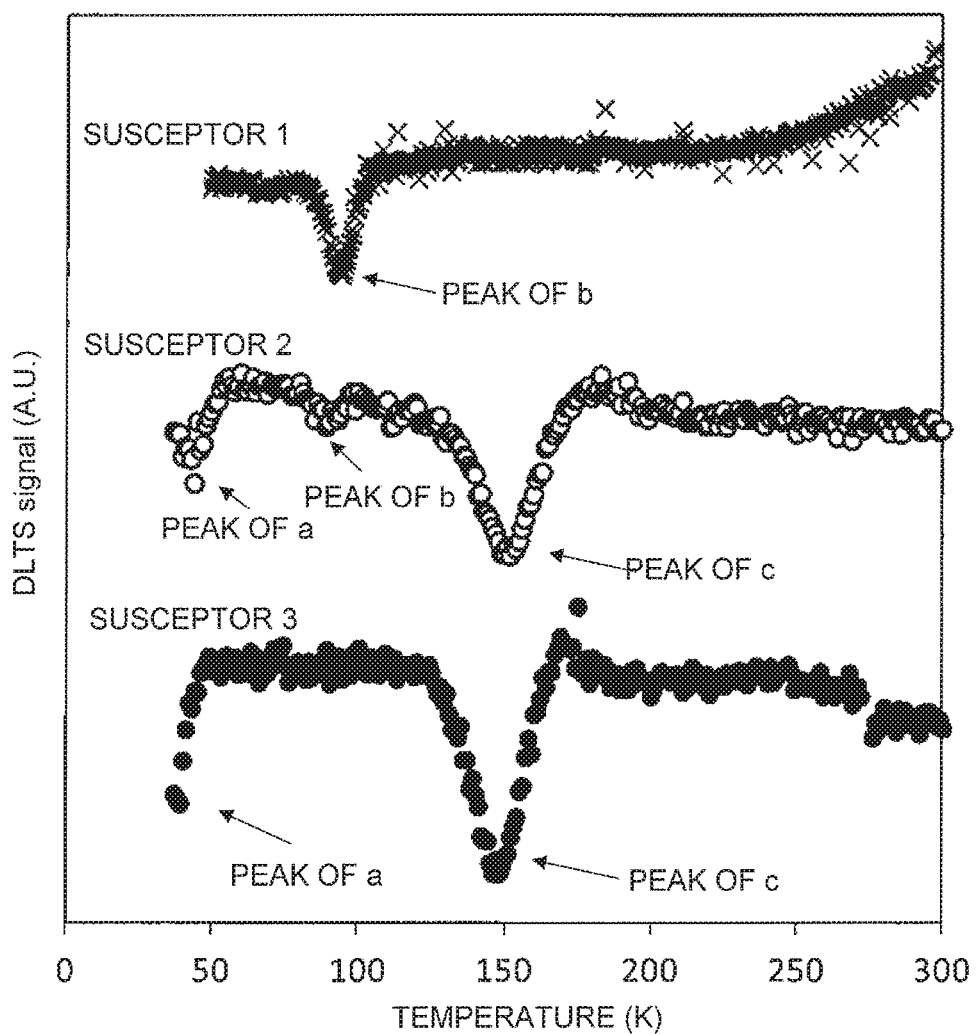

METHOD OF EVALUATING MANUFACTURING PROCESS OF SILICON MATERIAL AND MANUFACTURING METHOD OF SILICON MATERIAL

CROSS-REFERENCE TO RELATED APPLICATIONS

This application claims priority under 35 U.S.C 119 to Japanese Patent Application No. 2016-250552 filed on Dec. 26, 2016. The above application is hereby expressly incorporated by reference, in its entirety.

BACKGROUND OF THE INVENTION

Field of the Invention

The present invention relates to a method of evaluating a manufacturing process of a silicon material, and to a manufacturing method of a silicon material.

Discussion of the Background

Reduction of heavy metal contamination is always demanded for silicon materials such as a silicon wafer and an ingot of a silicon single crystal. The reason is that, for example, heavy metal contamination in a silicon wafer to be used as a semiconductor substrate causes deterioration of device properties. On the other hand, examples of causes for generating heavy metal contamination in a silicon material include adhesion or mixing of heavy metal to or into the silicon material, the heavy metal being derived from a manufacturing process, such as a member used in the manufacturing process of a silicon material (see, for example, Japanese Unexamined Patent Publication (KOKAI) No. 2000-327461 and Japanese Unexamined Patent Publication (KOKAI) Heisei No. 11-240780, which are expressly incorporated herein by reference in their entirety).

SUMMARY OF THE INVENTION

In order to stably supply high-quality silicon materials each having a low level of heavy metal contamination from a manufacturing process, it is required that a process maintenance work (replacement or repair) is performed so as to eliminate a heavy metal contamination source in a manufacturing process of a silicon material. For that purpose, desirably, a heavy metal contamination source of a silicon material generated in a manufacturing process of the silicon material can be estimated. The reason is that a target to be subjected to a process maintenance work is determinable by estimating a heavy metal contamination source. However, various possibilities (deterioration of a member, deterioration of a pipe, mixing from a gas or liquid to be used in a manufacturing process, and the like.) are assumed as factors that cause heavy metal contamination of a silicon material in a manufacturing process of the silicon material, and thus considerable trial and error is necessary in order to estimate, without any indicator, a heavy metal contamination source. Accordingly, estimation of a heavy metal contamination source of a silicon material has not been easy so far.

An aspect of the present invention provides for a novel method capable of estimating a heavy metal contamination source of a silicon material in a manufacturing, process of the silicon material.

The present inventors have made intensive studies in order to provide the above novel method and have obtained new findings below.

In a manufacturing process of a silicon material, there are cases where a member containing a carbon-containing sintered body such as graphite or silicon carbide is used (see, for example, the above publications). A sintered body is a solid material obtained by heating and solidifying powder at a temperature lower than the melting point. A carbon-containing sintered body is manufactured with the use of powder which contains carbon. For example, graphite is a sintered body of carbon powder, and a silicon carbide sintered body is a sintered body of silicon carbide powder. In repeated examinations, the present inventors have presumed that, when a member containing a carbon-containing sintered body is a heavy metal contamination source of a silicon material manufactured in a manufacturing process of the silicon material, contamination by heavy metal is generated together with contamination by carbon, in the silicon material. This point will be further described later. Under the presumption, the present inventors have focused on a DLTS method (Deep-Level Transient Spectroscopy) capable of evaluating both carbon and heavy metal contained in a silicon sample and have made further intensive studies to thereby complete the present invention.

When contamination by carbon and contamination by heavy metal are detected at the same time in a silicon material manufactured by a manufacturing process of the silicon material, the contamination by carbon is generated by adherence of carbon contained in the sintered body to the silicon material. On the other hand, a member containing a sintered body is produced by addition of a sintering additive or a resin in order to form raw material powder into a desired member shape. In a member containing a carbon-containing sintered body, heavy metal inevitably mixed as impurities derived from the sintering additive or resin is usually contained, and when the member deteriorates to such an extent that a process maintenance work is required, the heavy metal contained in the member adheres to the silicon material to thereby generate heavy metal contamination in the silicon material. In such a case, when DLTS measurement is performed on a silicon material, simultaneous detection of a peak of a carbon-related level and a peak of a heavy metal-related level is a new finding that has not been known so far and has been found by the present inventors. Furthermore, as the result of performing DLTS measurement on a silicon material on the basis of the finding, the present inventors have also newly found that members other than a member containing a carbon-containing sintered body can be estimated to be a heavy metal contamination source when only a peak of a heavy metal-related level is detected and there is no peak of a carbon-related level detected. That is, it has become clear as the result of intensive studies by the present inventors that a heavy metal contamination source of a silicon material manufactured in a manufacturing process using a member containing a carbon-containing sintered body can be estimated by using, as indicators, the presence/absence of detection of a peak of a carbon-related level and the presence/absence of detection of a peak of a heavy metal-related level.

An aspect of the present invention relates to:

a method of evaluating a manufacturing process of a silicon material (hereinafter, also described simply as an "evaluation method"), wherein the manufacturing process includes a process that uses a member containing a carbon-containing sintered body (hereinafter, also described simply as a "member"), the method of evaluating the manufacturing process of a silicon material includes:

performing DLTS measurement on a silicon material manufactured in the manufacturing process; and estimating a heavy metal contamination source of a silicon material manufactured in the manufacturing process with an indicator in the form of presence/absence of detection of a peak of a carbon-related level and presence/absence of detection of a peak of a heavy metal-related level in a DLTS spectrum obtained by the DLTS measurement.

In an embodiment, the evaluation method includes: estimating that a heavy metal contamination source of a silicon material manufactured in the manufacturing process is the member containing a carbon-containing sintered body when a peak of a heavy metal-related level and a peak of a carbon-related level are detected in a DLTS spectrum obtained by the DLTS measurement.

In an embodiment, the evaluation method includes: estimating that a heavy metal contamination source of a silicon material manufactured in the manufacturing process is a member other than the member containing a carbon-containing sintered body when a peak of a heavy metal-related level is detected and there is no peak of a carbon-related level detected in a DLTS spectrum obtained in the DLTS measurement.

In an embodiment, the carbon-containing sintered body is graphite.

In an embodiment, the member containing a carbon-containing sintered body is a member having a carbon-containing film on a carbon-containing sintered body.

In an embodiment, the carbon-containing film is a carbon-containing vapor-deposition film.

In an embodiment, the carbon-containing vapor-deposition film is a silicon carbide vapor-deposition film.

In an embodiment, the above evaluation method includes: introducing hydrogen atoms into a sample for measurement cut out from the silicon material; and subjecting the sample for measurement into which hydrogen atoms have been introduced to the DLTS measurement without performing an electron beam irradiation treatment.

In an embodiment, the introduction of hydrogen atoms into the sample for measurement is performed by immersing the sample for measurement in hydrofluoric acid.

In an embodiment, the silicon material is a silicon wafer.

In an embodiment, the member containing a carbon-containing sintered body is a susceptor to be used in a heat treatment process.

A further aspect of the present invention relates to a method of manufacturing a silicon material (hereinafter, also described simply as a "manufacturing method"), which includes:

manufacturing a silicon material in a manufacturing process of a silicon material including a process that uses a member containing a carbon-containing sintered body;

evaluating the manufacturing process of a silicon material by the method by using at least one silicon material manufactured in the manufacturing process of a silicon material; and further manufacturing a silicon material in the manufacturing process of a silicon material after replacing or repairing the member containing a carbon-containing sintered body, when the member containing a carbon-containing sintered body is estimated to be a heavy metal contamination source of a silicon material manufactured in the manufacturing process of a silicon material, as a result of the evaluation.

According to an aspect of the present invention, it is possible to provide an evaluation method of a manufacturing process of a silicon material capable of estimating that, in a manufacturing process of a silicon material including a process using a member containing a carbon-containing sintered body, when the member is a heavy metal contamination source of a silicon material, the member is a heavy metal contamination source. In addition, according to an aspect of the present invention, it is also possible to estimate that, when a member other than the member containing a carbon-containing sintered body is a heavy metal contamination source, the member containing a carbon-containing sintered body is not a heavy metal contamination source. Furthermore, by evaluating a manufacturing process of a silicon material with the use of the evaluation method and performing replacement or repair of the member containing a carbon-containing sintered body on the basis of the evaluation result in a manufacturing process of a silicon material, it becomes possible to stably supply a silicon material in which heavy metal contamination caused by the member containing a carbon-containing sintered body is prevented or reduced.

Other exemplary embodiments and advantages of the present invention may be ascertained by reviewing the present disclosure and the accompanying drawing(s).

BRIEF DESCRIPTION OF THE DRAWINGS

The present invention will be described in the following text by the exemplary, non-limiting embodiments shown in the drawing, wherein:

FIG. 1 shows DLTS spectra obtained by performing DLTS measurements for silicon epitaxial wafers manufactured under different manufacturing conditions.

DETAILED DESCRIPTION OF THE EMBODIMENTS

Unless otherwise stated, a reference to a compound or component includes the compound or component by itself, as well as in combination with other compounds or components, such as mixtures of compounds.

As used herein, the singular forms "a," "an," and "the" include the plural reference unless the context clearly dictates otherwise.

Except where otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not to be considered as an attempt to limit the application of the doctrine of equivalents to the scope of the claims, each numerical parameter should be construed in light of the number of significant digits and ordinary rounding conventions.

Additionally, the recitation of numerical ranges within this specification is considered to be a disclosure of all numerical values and ranges within that range. For example, if a range is from about 1 to about 50, it is deemed to include, for example, 1, 7, 34, 46.1, 23.7, or any other value or range within the range.

The following preferred specific embodiments are, therefore, to be construed as merely illustrative, and non-limiting to the remainder of the disclosure in any way whatsoever. In this regard, no attempt is made to show structural details of the present invention in more detail than is necessary for fundamental understanding of the present invention; the description taken with the drawings making apparent to those skilled in the art how several forms of the present invention may be embodied in practice.

[Method of Evaluating Manufacturing Process of Silicon Material]

An aspect of the present invention relates to a method of evaluating a manufacturing process of a silicon material, wherein the manufacturing process includes a process that uses a member containing a carbon-containing sintered body, the method of evaluating the manufacturing process of a silicon material includes performing DLTS measurement on a silicon material manufactured in the manufacturing process; and estimating a heavy metal contamination source of a silicon material manufactured in the manufacturing process with an indicator in the form of presence/absence of detection of a peak of a carbon-related level and presence/absence of detection of a peak of a heavy metal-related level in a DLTS spectrum obtained by the DLTS measurement.

The above evaluation method will be described in more detail below.

<Manufacturing Process to be Evaluated>

The manufacturing process to be evaluated in the evaluation method can include manufacturing processes known as manufacturing processes of silicon materials to be used in various applications. Examples can include a growth process of an ingot of a silicon single crystal by the Czochralski method (CZ method), and can include a manufacturing process of a silicon wafer by cutting out a silicon wafer from the grown ingot and subjecting the cut-out silicon wafer to various processing processes (heat treatment; mechanical treatments such as polishing and grinding; ion implantation treatment; cleaning treatment; and the like.).

<Member Containing Carbon-Containing Sintered Body>

The manufacturing process includes a process that uses a member containing a carbon-containing sintered body. An embodiment of a member containing a carbon-containing sintered body can include a member having a film on a carbon-containing sintered body (base material). In addition, another embodiment can include a member in which a carbon-containing sintered body such as a member consisting of a carbon-containing sintered body is positioned at the outermost surface of the member. Examples of carbon-containing sintered bodies can include graphite, silicon carbide sintered body and the like, and its carbon content is not particularly limited. In a member of an embodiment having a film on a base material, examples of films can include various films usually provided on a member to be used in a manufacturing process of a silicon material. Specific examples of such films can include a carbon-containing film, and a state of carbon contained in the carbon-containing film is not limited. Carbon contained in the carbon-containing film may be crystalline carbon or amorphous carbon (that is, vitreous carbon). The carbon-containing film may contain crystalline carbon and vitreous carbon. In addition, the carbon content in the carbon-containing film is not particularly limited. The carbon-containing film can be any of various carbon-containing films deposited on a base material by a known film deposition method such as vapor-deposition, thermal decomposition and the like. Examples of carbon-containing vapor-deposition films include a silicon carbide (SiC) vapor-deposition film. The silicon carbide vapor-deposition film can be deposited on a base material by vapor-deposition using silicon carbide as a vapor-deposition source. The silicon carbide vapor-deposition film is excellent in heat resistance, durability and the like and thus is preferable. Examples of vapor-deposition methods include known methods such as a CVD (chemical vapor-deposition) method and a vacuum vapor-deposition method. Furthermore, examples of methods for covering a base material with vitreous carbon to thereby form a carbon-containing film (vitreous carbon film) include: a method in which a base material is impregnated with resin or is covered with resin, and after that, the resin is carbonized at high temperatures; a method in which a carbon-containing film deposited on a base material by vapor-deposition or the like is modified with laser or the like; and the like. The thickness of the carbon-containing film ranges from, for example, approximately 1 μm; to 200 μm, but the thickness is not limited in the range.

The member can be, for example, various members to be used in a heat treatment process. Examples of such members can include: wafer-placing members such as a susceptor to be used in a heat treatment process (specifically, a susceptor on which a silicon wafer is placed in a heat treatment furnace) and a heat treatment boat; constituent members of a heat treatment furnace such as a furnace core tube and a liner tube in a heat treatment furnace; and the like. Examples of heat treatment processes that use such members can include: an epitaxial growth process performing epitaxial growth (vapor phase growth) for forming an epitaxial layer of a silicon epitaxial wafer; an annealing process for manufacturing an annealed wafer, and the like. In addition, the member can also be, for example, a holding member for holding a silicon wafer in a heat treatment process, or a transfer member for transferring a silicon wafer to a heat treatment process. Furthermore, the member can also be a constituent member of an ion implantation apparatus to be used in an ion implantation process performing ion implantation to a silicon wafer. The member can also be a member to be used for manufacturing an ingot of a silicon single crystal from which a silicon wafer in a wafer shape is cut out (for example, a member for an apparatus for pulling up, such as a crucible, heater and the like).

<DLTS Measurement>

(Silicon Material to be Measured)

For evaluating the above-described manufacturing process of a silicon material, in the evaluation method of an aspect of the present invention, a silicon material which has been manufactured with the use of the member is subjected to DLTS measurement. A silicon material to be subjected to DLTS measurement may be of n-type or p-type. Furthermore, the dopant concentration (that is, resistivity), oxygen concentration and the like are not also limited. An embodiment of a silicon material includes a silicon material in a wafer shape, that is, a silicon wafer. The silicon wafer may be a silicon single crystal wafer (so-called bare wafer, polished wafer), or may be a wafer having one or more layers on a silicon single crystal wafer. Specific examples of such layers can include an epitaxial layer. However, a silicon material to be measured is not limited to a silicon wafer. For example, a silicon material to be measured can also include an ingot of a silicon single crystal or a part of the ingot.

(Pretreatment)

DLTS measurement can be usually performed on a sample element produced by forming a semiconductor junction (Schottky junction or pn junction) on a silicon sample obtained by cutting out a part of the silicon material. Generally, the surface of a sample to be subjected to DLTS measurement has preferably high smoothness. Therefore, etching, polishing processing or the like for enhancement of the surface smoothness can also be optionally performed on a silicon material before the cutting-out of a silicon sample or for a silicon sample obtained by the cutting-out of a silicon material. Mirror etching is preferable as the etching. Furthermore, polishing processing preferably includes mirror polishing processing. For example, when a silicon material to be measured is an ingot of a silicon single crystal or a part of the ingot, a sample element is preferably produced after polishing processing of a silicon sample cut out from the silicon material, and a sample element is more preferably produced after mirror polishing processing. Known polishing processing given to a silicon wafer, such as mirror polishing processing, can be performed as the polishing processing. When a silicon material to be measured is a silicon wafer, a silicon wafer is usually obtained via polishing processing such as mirror polishing processing. Therefore, the surface of a silicon sample cut out from a silicon wafer has usually high smoothness even without polishing processing.

A pretreatment for activating a trap level in the band gap of silicon is preferably performed on a silicon sample before producing a sample element. An embodiment of such pretreatment can include an electron beam irradiation treatment. With regard to conditions for the electron beam irradiation treatment, various conditions which are known for electron beam irradiation treatment in DLTS measurement can be applied.

Furthermore, an embodiment of the pretreatment can include introduction of hydrogen atoms. A silicon sample after the introduction of hydrogen atoms is preferably subjected to DLTS measurement without performing the electron beam irradiation treatment. With regard to the electron beam irradiation treatment, for example, lead time is long, large-scale facilities are required, cost increase is caused, a heat treatment for producing a protective oxidized film and recovery treatment is required in addition to the electron beam irradiation process to thereby increase the number of processes. Therefore, DLTS measurement is preferably performed without performing an electron beam irradiation treatment. In the present invention and description, "without performing an electron beam irradiation treatment" means that a treatment in which a silicon sample is actively irradiated with electron beams is not performed, and electron beam irradiation inevitably generated under the sun light, illumination and the like is assumed to be permitted.

The introduction of hydrogen atoms may be performed by a dry treatment (dry system) or may be performed by a wet treatment (wet system, that is, the use of a solution). For example, the introduction of hydrogen atoms by a dry treatment can be performed by an ion implantation method, hydrogen plasma, and the like. The introduction of hydrogen atoms in the present invention and description is assumed to include a form in which hydrogen atoms are introduced in a state of ions or plasma.

The introduction of hydrogen atoms by a wet treatment can be performed by bringing a silicon sample into contact with a solution (for example, by immersion). The solution to be used here may be an acidic solution or a basic solution as long as it is a solution containing hydrogen atoms in any state such as a state in which hydrogen atoms are dissociated (ions) or a salt state. Examples of acidic solutions can include hydrofluoric acid, a mixed solution of hydrofluoric acid and nitric acid (fluonitric acid), a mixed solution of sulfuric acid and hydrogen peroxide, a mixed solution of hydrochloric acid and hydrogen peroxide, and the like. In addition, examples of basic solutions can include a sodium hydroxide solution, a potassium hydroxide solution, a mixed solution of aqueous ammonia and hydrogen peroxide, and the like. The above various solutions are preferably water-based solutions (solutions containing water), and are more preferably aqueous solutions. Acid concentration in the acidic solutions and basic concentration in the basic solutions are not particularly limited. As an example, the introduction of hydrogen atoms by hydrofluoric acid can be performed by immersing, in 1 to 25% by mass of hydrofluoric acid, a silicon sample or a silicon material to be measured from which a silicon sample is to be cut out, for 1 to 10 minutes. After the immersion, the sample to be measured may be subjected to post treatments such as water washing and drying, as necessary.

Specific Embodiment of DLTS Measurement

After the pretreatment described above, DLTS measurement of a silicon sample can be performed. The DLTS measurement can be performed by a known method. Usually, the DLTS measurement is performed by the method below. A semiconductor junction (Schottky junction or pn junction) is formed on one surface of a silicon sample and an ohmic layer is formed on the other surface, to thereby produce a sample element (diode). Transient response of capacitance of the sample element is measured by periodically applying voltage while temperature sweeping is performed. The application of voltage is usually performed by alternately and periodically applying a reverse voltage for forming a depletion layer and a weak voltage near 0V for capturing carries within the depletion layer. A DLTS spectrum can be obtained by plotting the DLTS signal relative to the temperature. Peaks of respective trap levels can be separated and detected by subjecting a DLTS spectrum obtained as the sum of respective peaks detected by the DLTS measurement to fitting processing by a known method. As a result, when a peak of a carbon-related level and a peak of a heavy metal-related level are detected, it is estimated that, in a manufacturing process of a silicon material to be evaluated, carbon contamination and heavy metal contamination are generated in the silicon material due to a member containing a carbon-containing sintered body. That is, the member containing a carbon-containing sintered body is estimated to be a contamination source of the silicon material in a manufacturing process of a silicon material to be evaluated. In contrast, for example, when only a peak of either a carbon-related level or a heavy metal-related level is detected, it can be estimated that the member is not so deteriorated seriously as to become a contamination source to be eliminated from the manufacturing process (that is, a contamination source that requires process maintenance work).

In the present invention and description, heavy metal means transition metal. Examples of the heavy metal include Ti, Fe, Co, Ni, Cu, W, Pt and the like. Peak attribution information for determining that a peak in a DLTS spectrum is a peak derived from a level relating to any heavy metal is known from literature(s).

On the other hand, one or more trap levels generally known as carbon-related levels can be adopted as a carbon-related level. Furthermore, one or more trap levels selected from the group consisting of Ec (energy on the bottom of conduction band)—0.10 eV, Ec—0.13 eV and Ec—0.15 eV can also be used as the carbon-related levels. Among these, one or more trap levels selected from the group consisting of the above three trap levels is preferably used as the carbon-related levels, when the pretreatment is performed by hydrogen atom introduction. For example, in DLTS measurement with 250 Hz in frequency, trap level density at Ec—0.10 eV can be measured on the basis of peak intensity (DLTS signal intensity) of a peak near 76 K, trap level density at Ec—0.13 eV can be measured on the basis of peak intensity of a peak near 87 K, and trap level density at Ec—0.15 eV can be measured on the basis of peak intensity of a peak near 101 K. A peak to be used for estimating a contamination source is, for example, at least one of the above three peaks, and two or three peaks may be used. From the viewpoint of performing evaluation with higher accuracy, the trap level at Ec—0.13 eV and/or Ec—0.15 eV is preferably used as a carbon-related level.

Examples of factors generating heavy metal contamination in a silicon material by a member containing a carbon-containing sintered body include deterioration of the carbon-containing sintered body. Furthermore, in the case of a member having a film on a carbon-containing sintered body (base material), deterioration of the film is also included. For example, a partial lack (called a pin hole) or breakage (called a crack) is generated in the film due to deterioration of the film, the base material under the film may be exposed and components of the base material (carbon-containing sintered body) may adhere to the silicon material to thereby contaminate the silicon material. For example, when the deterioration of a member as described above is generated, there are cases where the member acts as a contamination source to thereby generate heavy metal contamination in the silicon material together with carbon contamination. According to the evaluation method of an aspect of the present invention, it is possible to estimate that the member is the contamination source (heavy metal contamination source and furthermore, carbon contamination source) as a result of detection of a peak of a carbon-related level and a peak of a heavy metal-related level in the DLTS spectrum (that is, to estimate as a heavy metal contamination source). The member having been estimated to be a heavy metal contamination source is preferably replaced or repaired. The repair of the member can be performed by re-deposition or the like of a film in the case of a member having a film, and by deposition or the like of a film in the case of a member not having a film.

On the other hand, a heavy metal contamination source of a silicon material may be a member other than a member containing a carbon-containing sintered body. In such a case, according to the above evaluation method, it is possible to estimate that a member other than a member containing a carbon-containing sintered body is a heavy metal contamination source of the silicon material, from the fact that a peak of a heavy metal-related level is detected and there is no peak of a carbon-related level detected in a DLTS spectrum. Examples of the heavy metal contamination source of the silicon material other than the member containing a carbon-containing sintered body include deteriorated gas piping or the like in a manufacturing process. However, the source is not limited to the above.

Heavy metal contamination of a silicon material in a manufacturing process of the silicon material can be generated by various factors. Therefore, considerable trial and error is required in order to estimate, without army indicator, a heavy metal contamination source. Accordingly, estimation of a heavy metal contamination source has not been easy so far. In contrast, according to the evaluation method having been newly found by the present inventors, a heavy metal contamination source of a silicon material can be estimated by such a simple method as performing DLTS measurement on a silicon material manufactured in a manufacturing process to be evaluated. Specifically, it can be estimated whether or not a heavy metal contamination source is a member containing a carbon-containing sintered body.

[Method of Manufacturing Silicon Material]

A further aspect of the present invention relates to a method of manufacturing a silicon material, which includes manufacturing a silicon material in a manufacturing process of a silicon material including a process that uses a member containing a carbon-containing sintered body; evaluating the manufacturing process of a silicon material by the method by using at least one silicon material manufactured in the manufacturing process of a silicon material; and further manufacturing a silicon material in the manufacturing process of a silicon material after replacing or repairing the member containing a carbon-containing sintered body, when the member containing a carbon-containing sintered body is estimated to be a heavy metal contamination source of a silicon material manufactured in the manufacturing process of a silicon material, as a result of the evaluation.

The manufacturing process of manufacturing a silicon material in the above manufacturing method is as described above. In addition, in the above manufacturing method, the manufacturing process is evaluated by the evaluation method described in detail above, with the use of at least one manufactured silicon material. As a result of the evaluation, when a member containing a carbon-containing sintered body used in the manufacturing process is estimated to be a contamination source of the silicon material, the manufacturing of a silicon material is restarted after replacing or repairing the member containing a carbon-containing sintered body. In this way, it becomes possible to stably supply high-quality silicon materials obtained by preventing or reducing contamination caused by a carbon-containing sintered body.

EXAMPLES

The present invention will be described in greater detail below through Examples. However, the present invention is not limited to the embodiments shown in Examples.

1. Manufacturing of Epitaxial Wafer (Manufacturing of Silicon Material in Silicon Material Manufacturing Process)

A plurality of silicon wafers (200 mm in diameter, n-type, 0.01 Ω·cm in resistivity) having been previously confirmed to be free from heavy metal contamination were prepared. Each of the plurality of silicon wafers was placed on a susceptor in an epitaxial growth furnace in another apparatus and epitaxial growth was performed to form an epitaxial layer (resistivity: 25 Ω·cm to 50 Ω·cm), with the result that epitaxial wafers were manufactured. Three kinds of epitaxial wafers (wafers 1 to 3) were manufactured under different manufacturing conditions. The susceptor used for manufacturing the wafer 2 has longer accumulated operating time than the susceptor used in manufacturing the wafer 1. The wafer 3 is a wafer manufactured with the use of a susceptor having shorter accumulated operating time than the susceptor used for manufacturing the wafer 1, in an epitaxial growth furnace having longer accumulated operating time of a furnace member (gas pipe arrangement) than epitaxial growth furnaces used for manufacturing the wafers 1 and 2. Each of the susceptors used for manufacturing respective wafers has a silicon carbide vapor-deposition film (CVD-SiC film) having a thickness of about 120 μm on a graphite base material.

2. DLTS Measurement

A silicon sample for DLTS measurement was cut out from each of silicon epitaxial wafers. The cut-out silicon samples were sequentially subjected to (A), (B) and (C) below to form the Schottky junction on one surface of each silicon sample and to form an ohmic layer (Ga layer) on the other surface, with the result that sample elements were produced. Hydrogen atoms were introduced into the silicon sample by the (A) treatment (wet treatment) below.

(A) immersion in 5% by mass hydrofluoric acid for 5 minutes and after that, water washing for 10 minutes (B) formation of a Schottky electrode (Au electrode) by vacuum vapor-deposition on the epitaxial layer (C) formation of a backside ohmic layer by rubbing of A reverse voltage for forming a depletion layer and a pulse voltage for capturing carriers within the depletion layer were alternately and periodically applied to the Schottky junction of a sample element (diode) produced by giving the above (A) to (C) treatments. Transient response of capacitance of the diode generated in accordance with the voltages was measured.

The voltage application and capacitance measurement were performed while sample temperature was swept within a predetermined temperature range. The DLTS signal intensity ΔC was plotted relative to the temperature to give a DLTS spectrum. Measurement frequency was set to be 250 Hz. For the DLTS measurement, an electron beam irradiation treatment was not performed on silicon samples and sample elements.

The DLTS spectrum obtained for each of silicon epitaxial wafers was subjected to fitting processing (Ture shape fitting processing) with the use of a program manufactured by SEMILAB and was separated into a DLTS spectrum of a carbon-related level and a DLTS spectrum of a heavy metal-related level. As a result of the separation, in the DLTS spectrum obtained by performing DLTS measurement on the wafer 1 produced with the use of the susceptor 1, peaks of carbon-related levels were detected, but there was no peak of a heavy metal-related level detected. In the DLTS spectrum obtained by performing DLTS measurement on the wafer 2 produced with the use of the susceptor 2, peaks of carbon-related levels and peaks of Ti-related levels were detected. In the DLTS spectrum obtained by performing DLTS measurement for the wafer 3 produced with the use of the susceptor 3, there was no peak of a carbon-related level detected, but peaks of Ti-related levels were detected.

In the DLTS spectrum of each of the wafers 1 and 2 in winch peaks of carbon-related levels were detected, peaks of following carbon-related levels were detected:

trap level at Ec—0.10 eV (peak position: temperature 76 K), trap level at Ec—0.13 eV (peak position: temperature 87 K), and trap level at Ec—0.15 eV (peak position: temperature 101 K).

With respect to the DLTS spectra obtained for each of the silicon epitaxial wafers, fitting processing (lure shape fitting processing) was performed with the use of a program manufactured by SEMILAB, for the following trap levels:

trap level a at Ec—0.08 eV (Ti-related level),
trap level b at Ec—0.15 eV (carbon-related level), and
trap level c at Ec—0.27 eV (U-related level).

The spectra obtained by overlapping each of the obtained DLTS spectra are shown in FIG. 1. In FIG. 1, "A.U." means an arbitrary unit. Table 1 shows peak intensities of respective peaks in the DLTS spectra shown in FIG. 1. The peak intensity is represented by a relative value when the peak intensity of the trap level b (carbon-related level) of the wafer 1 is set to be 1.0.

TABLE 1

|  | | Peak intensity (relative value) | | |
| --- | --- | --- | --- | --- |
|  | Susceptor used | Trap level a (Ti-related level) | Trap level b (carbon-related level) | Trap level c (Ti-related level) |
| Wafer 1 | Susceptor having silicon carbide vapor-deposition film on graphite base material (accumulated operating time: middle) | Not detected | 1.0 | Not detected |
| Wafer 2 | Susceptor having silicon carbide vapor-deposition film on graphite base material (accumulated operating time: long) | 0.9 | 0.3 | 1.6 |
| Wafer 3 | Susceptor having silicon carbide vapor-deposition film on graphite base material (accumulated operating time: short) | 1.3 | Not detected | 2.3 |

From the comparison between the measurement result for the wafer 1 and the measurement result for the wafer 2, it can be confirmed that, when serious deterioration is generated in a susceptor having a film on a carbon-containing sintered body (in the above example, graphite), carbon contamination and heavy metal (Ti in the above example) contamination are generated in wafers manufactured with the use of the susceptor, and that the contamination can be detected by the DLTS measurement. It is considered that the contamination caused by the susceptor generated in the wafer 2 was generated by adherence, to the wafer, of carbon and Ti derived from the base material by the generation of a pin-hole and/or a crack in the film due to deterioration of the film of the susceptor.

When peaks of carbon-related levels and peaks of heavy metal-related levels are detected in the DLTS spectrum as in the measurement result for the wafer 2, the replacement or repair of the susceptor cam be performed, and thus, it is possible to prevent the generation of serious contamination (heavy metal contamination, and furthermore, carbon contamination) derived from the susceptor in silicon epitaxial wafers to be subsequently manufactured.

Furthermore, in the DLTS measurement for the wafer 3, there was no peak of a carbon-related level detected, but peaks of heavy metal (Ti in the above example)-related levels were detected. That is, carbon contamination was not confirmed, and heavy metal contamination was confirmed. In such a case, it can be estimated that a contamination source of the silicon material is not a susceptor containing a carbon-containing sintered body (graphite in the above example). As to the waver 3, furnace members (flange and gasket constituting gas piping arrangement) having longer accumulated operating time than that of the furnace members in epitaxial growth furnaces used in manufacturing wafers 1 or 2 were members containing Ti, and thus the furnace members are considered as a heavy metal contamination source.

In the above example, the trap level at Ec—0.15 eV was used as a carbon-related level, but a manufacturing process can be evaluated with the use of a carbon-related level such as the trap level at Ec—0.10 eV and/or the trap level at Ec—0.13 eV as the carbon-related level.

An aspect of the present invention can be useful in fields of manufacturing various silicon materials such as a silicon wafer.

Although the present invention has been described in considerable detail with regard to certain versions thereof, other versions are possible, and alterations, permutations and equivalents of the version shown will become apparent to those skilled in the art upon a reading of the specification. Also, the various features of the versions herein can be combined in various ways to provide additional versions of the present invention. Furthermore, certain terminology has been used for the purposes of descriptive clarity, and not to limit the present invention. Therefore, any appended claims should not be limited to the description of the preferred versions contained herein and should include all such alterations, permutations, and equivalents as fall within the true spirit and scope of the present invention.

Having now fully described this invention, it will be understood to those of ordinary skill in the art that the methods of the present invention can be carried out with a wide and equivalent range of conditions, formulations, and other parameters without departing from the scope of the invention or any Examples thereof.

All patents and publications cited herein are hereby fully incorporated by reference in their entirety. The citation of any publication is for its disclosure prior to the filing date and should not be construed as an admission that such publication is prior art or that the present invention is not entitled to antedate such publication by virtue of prior invention.

What is claimed is:

1. A method of determining whether a member having a carbon-containing sintered body used in a manufacturing of a silicon material is a heavy metal contamination source of the silicon material, the method comprising:
    manufacturing the silicon material using a process that includes contacting the silicon material with the member having a carbon-containing sintered body;
    performing deep-level transient spectrometry ("DLTS") measurement on the manufactured silicon material to obtain a DLTS spectrum;
    detecting whether a carbon-related level peak is present or absent from the DLTS spectrum;
    detecting whether a heavy metal-related level peak is present or absent from the DLTS spectrum;
    when the heavy metal-related level peak and the carbon-related level peak are detected as being present in the DLTS spectrum obtained by the DLTS measurement, determining that the member having the carbon-containing sintered body is the heavy metal contamination source of the manufactured silicon material; and
    replacing or repairing the member having the carbon-containing sintered body that was determined to be the heavy metal contamination source of the manufactured silicon material.

2. The method according to claim 1, wherein the carbon-containing sintered body comprises graphite.

3. The method according to claim 1, wherein the member having the carbon-containing sintered body is a member having a carbon-containing film on a carbon-containing sintered body.

4. The method according to claim 3, wherein the carbon-containing film is a carbon-containing vapor-deposition film.

5. The method according to claim 4, wherein the carbon-containing vapor-deposition film is a silicon carbide vapor-deposition film.

6. The method according to claim 1, further comprising:
    introducing hydrogen atoms into a sample for measurement cut out from the manufactured silicon material; and
    subjecting the sample for measurement into which hydrogen atoms have been introduced to the DLTS measurement without performing an electron beam irradiation treatment.

7. The method according to claim 6, wherein the introducing hydrogen atoms into the sample for measurement is performed by immersing the sample for measurement in hydrofluoric acid.

8. The method according to claim 1, wherein the manufactured silicon material is a silicon wafer.

9. The method according to claim 1, wherein the member having a carbon-containing sintered body is a susceptor to be used in a heat treatment process.

* * * * *